(12) United States Patent
Salim et al.

(10) Patent No.: US 12,028,084 B2
(45) Date of Patent: Jul. 2, 2024

(54) HYBRID-CYCLE QUANTUM-CLOCK FREQUENCY REGULATION

(71) Applicant: ColdQuanta, Inc., Boulder, CO (US)

(72) Inventors: Evan Salim, Lafayette, CO (US); Dina Genkina, Hyattsville, MD (US); Flavio Cruz, Superior, CO (US); Judith Olson, Northglenn, CO (US); Andrew Kortyna, Boulder, CO (US)

(73) Assignee: ColdQuanta, Inc., Boulder, CO (US)

( * ) Notice: Subject to any disclaimer, the term of this patent is extended or adjusted under 35 U.S.C. 154(b) by 656 days.

(21) Appl. No.: 17/221,047

(22) Filed: Apr. 2, 2021

(65) Prior Publication Data

US 2022/0156624 A1    May 19, 2022

Related U.S. Application Data

(60) Provisional application No. 63/113,433, filed on Nov. 13, 2020.

(51) Int. Cl.
| | |
|---|---|
| *H03L 7/26* | (2006.01) |
| *G04F 5/14* | (2006.01) |
| *H03B 17/00* | (2006.01) |
| *H04B 10/70* | (2013.01) |

(52) U.S. Cl.
CPC .............. *H03L 7/26* (2013.01); *G04F 5/145* (2013.01); *H03B 17/00* (2013.01); *H04B 10/70* (2013.01)

(58) Field of Classification Search
CPC .......... G04F 5/14; G04F 5/145; H03B 17/00; H03L 7/26; H04B 10/70

USPC ....................................................... 331/3, 94.1
See application file for complete search history.

(56) References Cited

U.S. PATENT DOCUMENTS

| | | | |
|---|---|---|---|
| 4,943,955 A | 7/1990 | Rabian | |
| 2016/0013795 A1* | 1/2016 | Sastrawan | ............... H03L 1/026 331/17 |
| 2018/0069557 A1 | 3/2018 | Maki | |
| 2021/0297085 A1 | 9/2021 | Shijo | |

OTHER PUBLICATIONS

Hafiz et al., Toward a High-Stability Coherent Poplulation Trapping Cs Vapor-Cell Atomic Clock Using Autobalanced Ramsey Spectroscopy, HAL Open Science, Nov. 30, 2019.
Shuker et al., Reduction of Light Shifts in Ramsey Spectroscopy with a Combined Error Signal, pp. 1-5, Mar. 1, 2019.

* cited by examiner

*Primary Examiner* — Levi Gannon
(74) *Attorney, Agent, or Firm* — Van Pelt, Yi & James LLP; Clifton Leon Anderson

(57) ABSTRACT

An atomic clock employs hybrid long/short quantum clock frequency regulation wherein each of a series of regulation cycles includes a relatively long (four Ramsey-cycle) combination error signal (CES) cycle and plural relatively short (two Ramsey-cycle) single error signal (SES) cycles. The CES cycles provide for better long-term stability than can be provided using only SES cycles. However, including the SES cycles between CES cycles improves short term stability with negligible diminishment of long-term stability.

12 Claims, 7 Drawing Sheets

HYBRID-CYCLE QUANTUM-CLOCK FREQUENCY REGULATION

This invention was made with government support under grant number FA9453-19-C-0625 awarded by the U.S. Air Force. The government has certain rights in the invention.

BACKGROUND

Atomic clocks are used as time standards as cumulative errors can be less than a second over a billion years. With their extreme precision and accuracy, atomic clocks are poised to play an important role in a wide variety of fundamental research activities including relativistic and chronometric geodesy, the measurement of possible variations of fundamental constants, the search for dark matter in the universe, and the detection of gravitational waves. In more commercial arenas, atomic clocks provide for high-speed communications systems and the Global Positioning System (GPS).

In many atomic clocks, the interaction of atoms with the probing field perturbs the atomic energy levels and induces a systematic frequency shift of the clock transition that limits the ultimate clock frequency stability and accuracy. These limitations are of major concern in several types of atomic clocks, including compact microwave atomic clocks based on coherent population trapping (CPT), as well as optical clocks based on the probing of ultra-narrow quadrupole, octupole, and two-photon transitions or direct frequency-comb spectroscopy.

Ramsey spectroscopy measures atomic and molecular spectra using two short interrogation pulses that are separated by a dark period. This reduces exposure to the probing field and allows for much higher frequency resolution. Although the atoms spend a significant amount of time in the dark, this Ramsey spectroscopy approach still suffers from a non-negligible residual sensitivity to frequency shifts induced during the interrogation or detection pulses. Thus, in a single-error signal (SES) approach, in which all inter-interrogation dark periods have the same duration, clock accuracy can suffer from long-term drift. A combined error signal (CES) approach addresses this long-term drift to Ramsey spectroscopy using two consecutive Ramsey subsequences with different dark durations; the CES approaches generates a combined error signal by subtracting the error signals obtained from the two Ramsey subsequences and normalizing the resulting difference.

DETAILED DESCRIPTION

Figure 1:
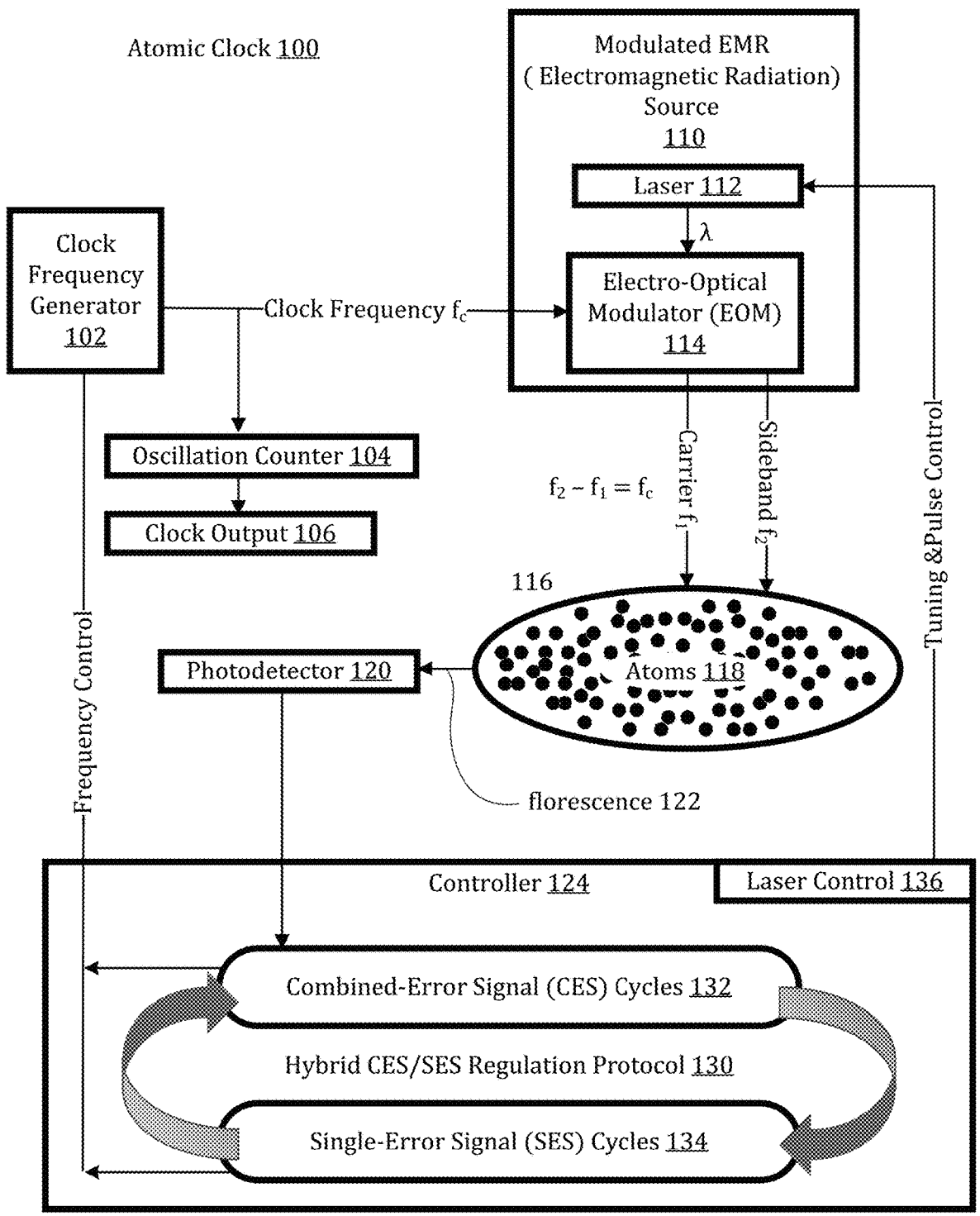
FIG. 1 is a schematic diagram of an atomic clock that implements a hybrid CES/SES regulation protocol to control clock frequency.

The present invention provides for regulating the clock frequency of a quantum (e.g., atomic) clock using a hybrid regulation protocol that includes both long and short clock-frequency adjustment cycles. The long adjustment cycles contain at least three measurement (e.g., Ramsey) cycles, while the short adjustment cycles contain at most two measurement (e.g., Ramsey) cycles.

The long adjustment cycles can be combined error signal (CES) cycles or auto-balanced Ramsey (ABR) cycles, while the short adjustment cycles can be single error signal (SES) frequency adjustment cycles. CES frequency adjustment cycles are superior to SES cycles in minimizing long-term clock frequency drift. However, including SES cycles along with the longer cycles helps minimize short-term clock frequency drift while having negligible deleterious impact on long-term drift. In fact, overall clock performance tends to be best when the ratio of short cycles to long cycles is 3:1 or greater.

A coherent population trapping (CPT) atomic clock 100 includes a clock frequency generator 102, which can be a microwave source, an oscillation counter 104 to count clock frequency oscillations, and a clock output 106 to convert the oscillation counts to time indications. The frequency $f_c$ output by clock frequency generator 102 is regulated using a modulated electromagnetic source 110 including a laser 112 and an electro-optical modulator 114, a vacuum cell 116 populated by atoms 118, a photodetector 120 for detecting fluorescence 122 from atoms 118, and a controller 124.

Controller 124 implements a hybrid CES/SES clock frequency regulation protocol 130 including CES cycles 132 and SES cycles 134. In the illustrated embodiment, the ratio of SES cycles to CES cycles is many-to-one, e.g., 5:1. Greater inherent stability of the atomic clock permits higher ratios and, concomitantly, lower short-term drift. In addition, controller 124 provides for laser control 136 of the tuning, pulse timing, and intensity of laser 112; in the illustrated embodiment, this control is independent of clock frequency regulation; in an alternative embodiment, a laser can be controlled in part as a function of feedback generated during clock frequency regulation cycles. For example, in one embodiment, the clock signal is used to control laser power instead of or in addition to frequency modulation.

Figure 2:
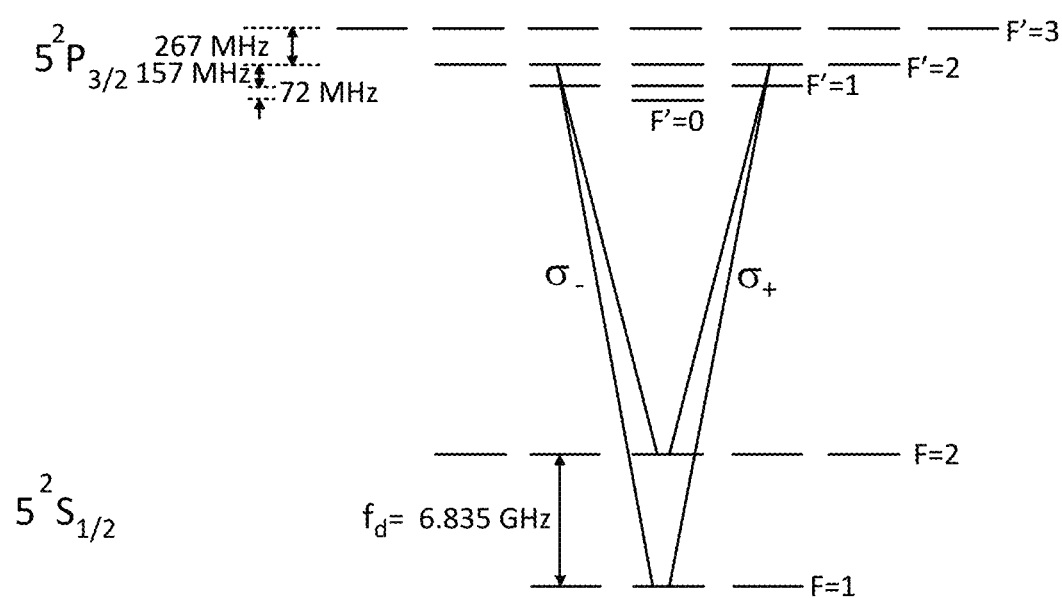
FIG. 2 is a level diagram for the rubidium 87 atoms used in the clock of FIG. 1.

The clock frequency $f_c$ is regulated by detecting and correcting deviations from a dark state associated with atoms 118. In the illustrated embodiment, the atoms are rubidium 87 ($^{87}$Rb), the relevant quantum levels of which are shown in FIG. 2. The F=1 and F=2 levels belong to a hyperfine structure of the $5^2S_{1/2}$ state. The resonant frequency $f_r$ for transitions between the F=1 level and the F=2 level is 6.835 GHz, which is in the microwave range. The clock frequency $f_c$ is regulated to match this target frequency $f_r$.

Laser 112, FIG. 1, outputs monochromatic light of wavelength λ and frequency $f_1$ that matches a resonant frequency of cold atoms 110. For example, a wavelength of λ=795 nanometers (nm) is resonant with the D1 line of $^{87}$Rb. Other lines of $^{87}$Rb and lines of other alkali, alkaline-earth, and other atoms and polyatomic molecules can be used with different wavelengths. The laser output is fed to EOM 114 which modulates the laser output at the clock frequency $f_c$ to produce a sideband signal with a frequency $f_2=f_1+f_c$. Bichromatic light, including frequencies $f_1$ and $f_2$, is directed from EOM 114 to atoms 118.

When clock frequency $f_c$ equals the resonant frequency $f_r$, frequency $f_1$ output by EOM 114 is resonant with the transition from F=2 to F'=2 (FIG. 2) and frequency $f_2$ output by EOM 114 is resonant with the transition from F=1 to F'=2. Other transitions, e.g., to levels F'=0, F'=1 and F'=3 are the main reason for the clock's sensitivity to power. Specifically, off-resonant coupling to other transitions induces a shift in the clock levels dependent on the laser power and power ratio between $f_1$ and $f_2$ components. When $f_c=f_r$, the output of EOM 114 can pump atoms 118 to a dark state in which they cannot absorb light of frequencies $f_1$ and $f_2$ so that the atoms do not emit fluorescence in response to illumination.

Figure 3:
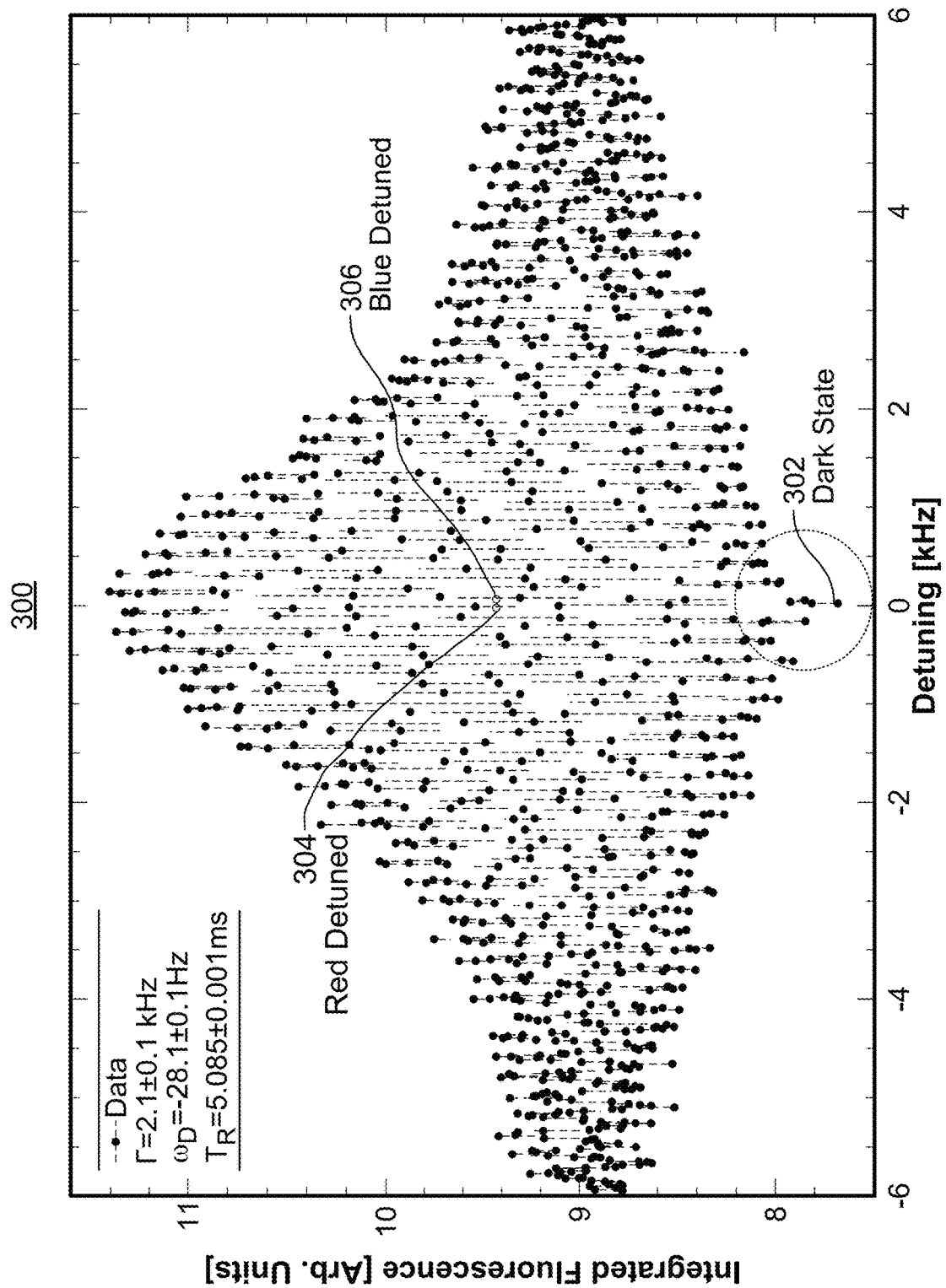
FIG. 3 is a graph of integrated fluorescence as a function of detuning relative to a dark state for the atomic clock of FIG. 1.

Graph 300 of FIG. 3 shows integrated fluorescence as a function of detuning for Ramsey interrogation (as opposed to continuous illumination). While some atoms populate the dark state for most detunings represented in graph, atoms populate the dark state most fully at resonant frequency 302.

The dark state can be detected as a zero or minimal fluorescence (integrated over time) detected at photodetector 120, which can be a photomultiplier tube (PMT). Higher fluorescence detections can be used to detect deviations from the dark state. However, direct detections of dark state deviations can be problematic: 1) since the integrated fluorescence does not indicate the direction of a deviation; and 2) the integrated fluorescence is not a sensitive indicator of frequency deviation in the vicinity of the dark state. Photodetector 120 is positioned outside the path of EMR through atoms 118 so that fluorescence, which is omnidirectional, can be measured independently of the EMR radiation. In an alternative embodiment, a photodetector is positioned in line with the EMR path through and beyond atoms 118 to measure EMR absorption instead of or in addition to fluorescence.

Away from the dark state, fluorescence can be a more sensitive measure of frequency, so greater frequency sensitivity can be achieved by detuning laser 112. Two measurements can be taken: one with laser 112 red-detuned to a frequency 304 below resonance and one with laser 112 blue-detuned to a frequency 306 above resonance. A comparison of the two measurements can then be used to indicate the degree and direction of deviation from the dark state. Thus, in the following detailed description of the clock frequency regulation protocol, dark state measurements involve red and blue detuned pairs of measurements.

Controller 124 is used to regulate the frequency $f_c$ of clock frequency generator 102 to match the resonant (microwave) frequency $f_r$ associated with the dark state. In accordance with the present invention, controller 124 employs a hybrid regulation protocol 130 that includes both combined-error-signal (CES) cycles 132 and single-error signal (SES) cycles 134. In the illustrated embodiment, plural SES cycles 134 are used for each CES cycle 132. A more stable atomic clock can limit long-term drift using CES less frequently and thus can leverage higher ratios of SES cycles to CES cycles to further reduce short-term drift.

Figure 4A:
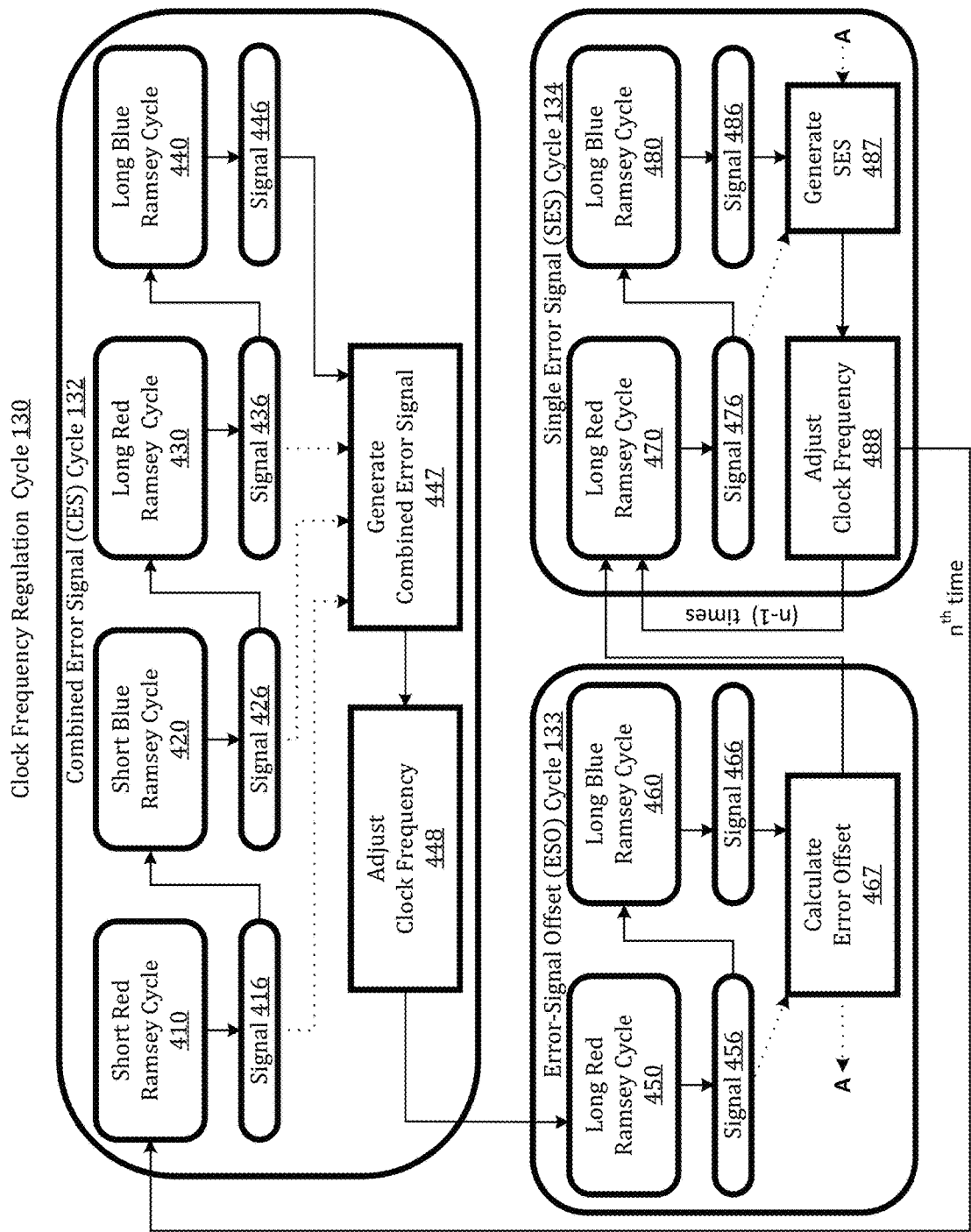
FIG. 4A is a flow diagram of a hybrid SES/CES clock-frequency regulation protocol implementable in the atomic clock of FIG. 1 and in other systems.

As shown in FIG. 4A, each regulation cycle 130 includes three types of error-signal cycles: a combined error signal CES cycle 132 followed by an error-signal offset (ESO) cycle 133 followed by plural, e.g., five, single-error signal (SES) cycles 134. A new regulation cycle begins once the $n^{th}$ SES cycle completes. Each CES cycle 132 includes four Ramsey spectroscopy cycles: a short red Ramsey cycle 410 with a readout signal 416, a short blue Ramsey cycle 420 with readout signal 426, a long red Ramsey cycle 430 with a readout signal 436, and a long blue Ramsey cycle 440 with a readout signal 446. Each ESO cycle 133 includes a long red Ramsey cycle 450 with an associated readout signal 456 and a long blue Ramsey cycle 460 with an associated readout signal 466. Each SES cycle includes a long red Ramsey cycle 470 with associated readout signal 476 and a long blue Ramsey cycle 480 with an associated readout signal 486.

Each CES cycle generates at 447 a combined error signal that is fed back to clock frequency generator 106 (FIG. 1) to adjust the clock frequency at 448. The CES error equals (signal 446–signal 436)–B*(signal 426–signal 416), where B is a calibrated coefficient. At 448, the CES adjustment is fc→fc+p*(CES error), where p is a proportionality constant for feedback. Each ESO cycle 123 generates at 467 an error offset signal. The error-signal offset signal ESO equals (signal 466–signal 456). The error offset signal ESO is used to offset a bias in the SES relative to the most-recent CES result. Each SES cycle generates at 487 a single error signal (SES) based on readouts 476 and 486 as well as the error-signal offset generated at 467. The SES error is equal to (signal 476–signal 297)–ESO. At 488, the SES adjustment is fc→fc+p*(SES error).

Figure 4B:
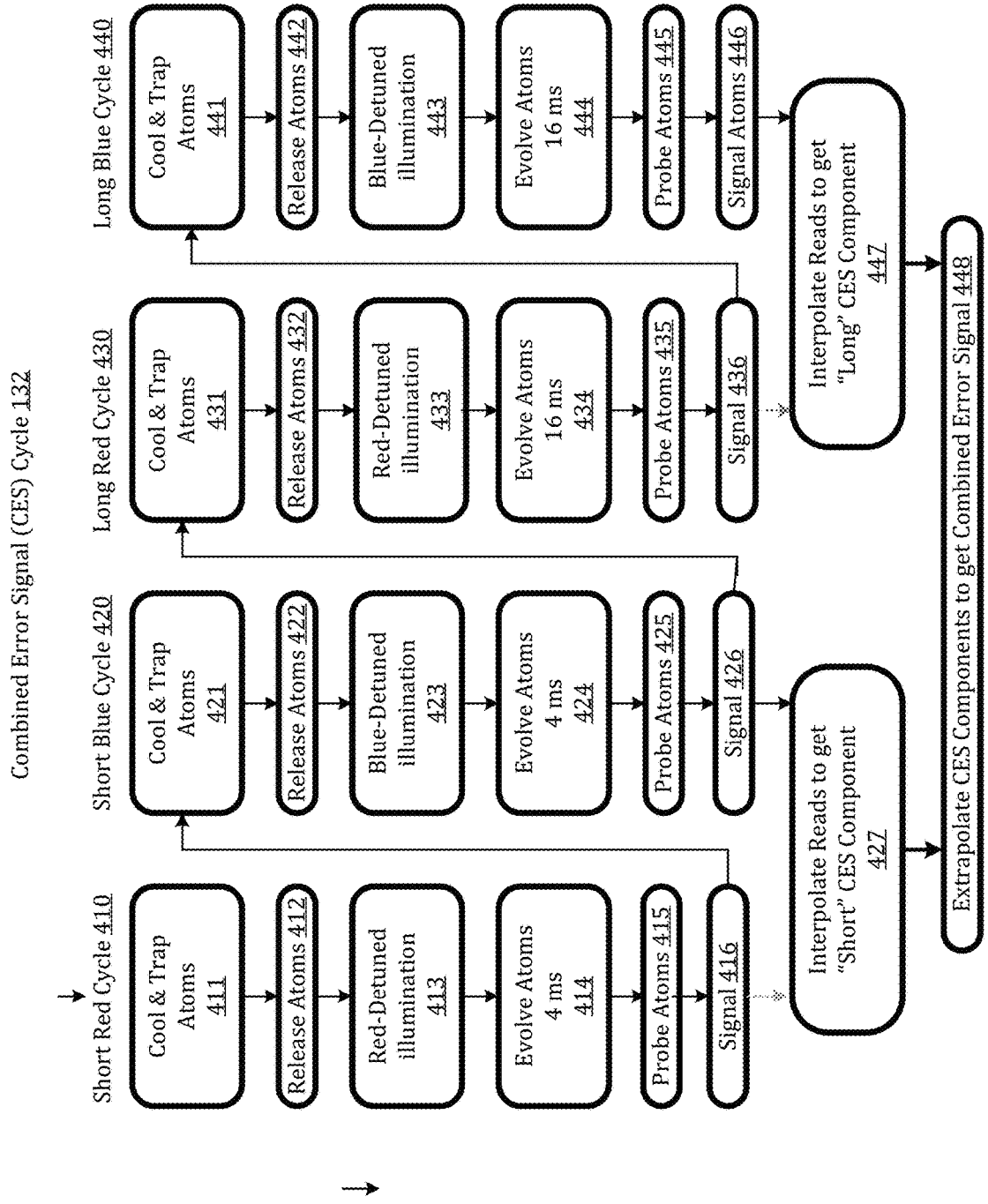
FIG. 4B is a flow diagram of a CES cycle of the regulation protocol of FIG. 4A.

As shown in FIG. 4B, short red Ramsey (measurement) cycle 410 includes: cooling and trapping atoms at 411, releasing atoms from the trap at 412, illuminating the released atoms with the red detuned laser light at 413 so as to pump them into the dark state, allowing atoms to evolve for a relatively short duration, e.g., four milliseconds (4 ms) at 414, probing the atoms (e.g., using resonant laser light) at 415, and generating a signal 416 corresponding to the integrated fluorescence emitted by the atoms and detected by photodetector 120 (FIG. 1) in response to the probe.

Short blue Ramsey cycle 420 includes: cooling and trapping atoms at 421, releasing atoms from the trap at 422, illuminating the released atoms with blue-detuned laser light at 423, allowing atoms to evolve for a relatively short duration at 424, probing the atoms at 425, and generating a signal 426 corresponding to the integrated fluorescence emitted by the atoms in response to the probe. Ramsey cycle 420 is the same as Ramsey cycle 410 except that atoms are illuminated by blue-detuned laser light instead of red-detuned laser light. In addition, Ramsey cycles 410 and 420 collectively include, in effect, interpolating signals 416 and 426 to obtain a "short" CES component 427.

Long red Ramsey cycle 430 includes: cooling and trapping atoms at 431, releasing atoms from the trap at 432, illuminating, the released atoms with the red detuned laser light at 433, allowing atoms to evolve for a relatively long duration at 434 (e.g., 16 ms), probing the atoms (e.g., using resonant laser light) at 435, and generating a signal 436 corresponding to the integrated fluorescence emitted by the atoms in response to the probe. Long red Ramsey cycle 430 is generally the same as short-red Ransey cycle 410 except for the longer evolve time.

Long blue Ramsey cycle 440 is generally the same as long red Ramsey cycle 430 except the atom illumination uses blue-detuned light as opposed to red-detuned light. Long blue Ramsey cycle 440 includes: cooling and trapping atoms at 441, releasing atoms from the trap at 442, illuminating the released atoms with the blue detuned laser light at 443, allowing atoms to evolve for a relatively long duration at 444, probing the atoms (e.g., using resonant laser light) at 445, and generating a signal 446 corresponding to the integrated fluorescence emitted by the atoms in response to the probe.

In atomic clock 100, the long cycles include two pairs of measurement cycles that differ in Ramsey evolve time (4 ms vs. 16 ms). In other embodiments, different evolve times are used. In still other embodiments, the distinguishing parameter is other than Ramsey evolve time. For example, the distinguishing parameter can be laser power or other parameter that varies linearly or otherwise in a known manner in the regime of interest.

Ramsey cycles 430 and 440 collectively include, in effect, interpolating signals 436 and 448 to obtain a "long" CES component 447. In addition, CES error signal cycle 132 includes, in effect, extrapolating CES components generated at 427 and 447 to get the combined error signal at 448. This combined error signal is then used to adjust the clock frequency G.

ESO cycle 133 (FIG. 4A) includes a long red Ramsey cycle 450 and a long blue Ramsey cycle 460 that are respectively the same as long red cycle 430 and long blue cycle 440 of CES cycle 132. Likewise, each SES cycle 134 includes a long red Ramsey cycle 470 and a long blue Ramsey cycle 480 that are respectively the same as long red cycle 430 and long blue cycle 440 of CES cycle 132. While the illustrated embodiment performs the various Ramsey cycles in a particular order, other embodiments perform the Ramsey cycles in other orders. For example, the order of red and blue Ramsey cycles can change and the short and long Ramsey cycles can be performed in various orders and can employ different evolve times.

In the illustrated embodiment, the cooling and trapping consumes about 100 milliseconds (ms). Illumination is performed with a laser pulse lasting about 1.5 ms. Post-illumination evolution of atoms consumes 4 ms in the short Ramsey cycles and 16 ms in the long Ramsey cycles. The probe pulse lasts about 0.1 ms. These values differ in other embodiments.

In principle, the longer the time between pulses in the Ramsey method, the more precise the measurement; ideally, atoms would evolve much longer than 16 ms before being probed. However, released atoms can fall under the influence of gravity and need to be recovered before they hit a cell boundary so that they can be reused for the next Ramsey cycle. In atomic clock 100, the CES cycles give readings after 4 ms and 16 ms. A linear extrapolation of these readings can be used to estimate the signal that would have resulting from a long evolve time.

Since each Ramsey cycle requires about 100 ms of cooling and trapping, the extra, each CES cycle consumes over 400 ms before a corresponding clock frequency adjustment is made. In addition, due to the intervening ESO cycle, another 400 ms passes before the next adjustment can be made. Thus, there are two cycles that are twice as long as an SES cycle. The longer cycles take more time to average the measurements down to get rid of noise, simply because fewer measurements are made per second. These errors can be minimized by including SES cycles between CES cycles.

Figure 5:
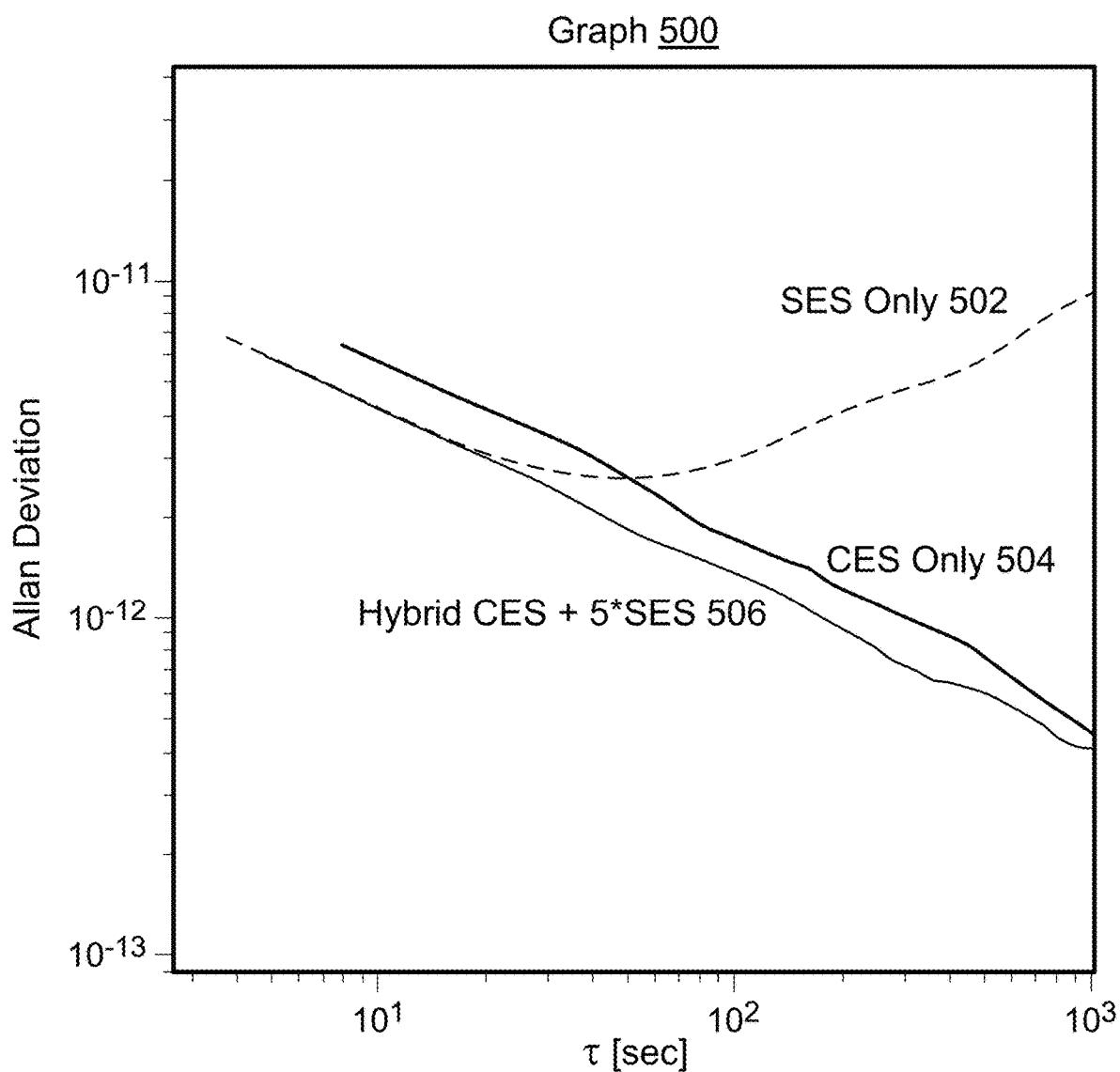
FIG. 5 is a graph comparing the performance of a hybrid SES/CES clock-regulation protocol with the performances of an SES-only protocol and a CES-only protocol.

Graph 500, FIG. 5, illustrates the advantages of the hybrid regulation cycle over purely CES and SES regulation cycles in terms of Allan deviation as a function of time T. The Allan deviation is a measure of frequency stability in clocks, oscillators and amplifiers. Graph 500 shows Allan deviations curves 502, 504, and 506, respectively for a hybrid regulation cycle with five SES cycles per CES cycle, an SES-only regulation cycle, and a CES-only regulation cycle. The hybrid regulation cycle has the lowest Allan deviation for the time interval represented in graph 500. The SES-only regulation cycle 504 matches the hybrid regulation cycle for short durations but performs poorly over longer deviations. The CES-only regulation cycle 506 greatly improves upon the long-term performance of the SES-only regulation cycle 504 but is nowhere quite as good as hybrid regulation cycle 502.

Figure 6:
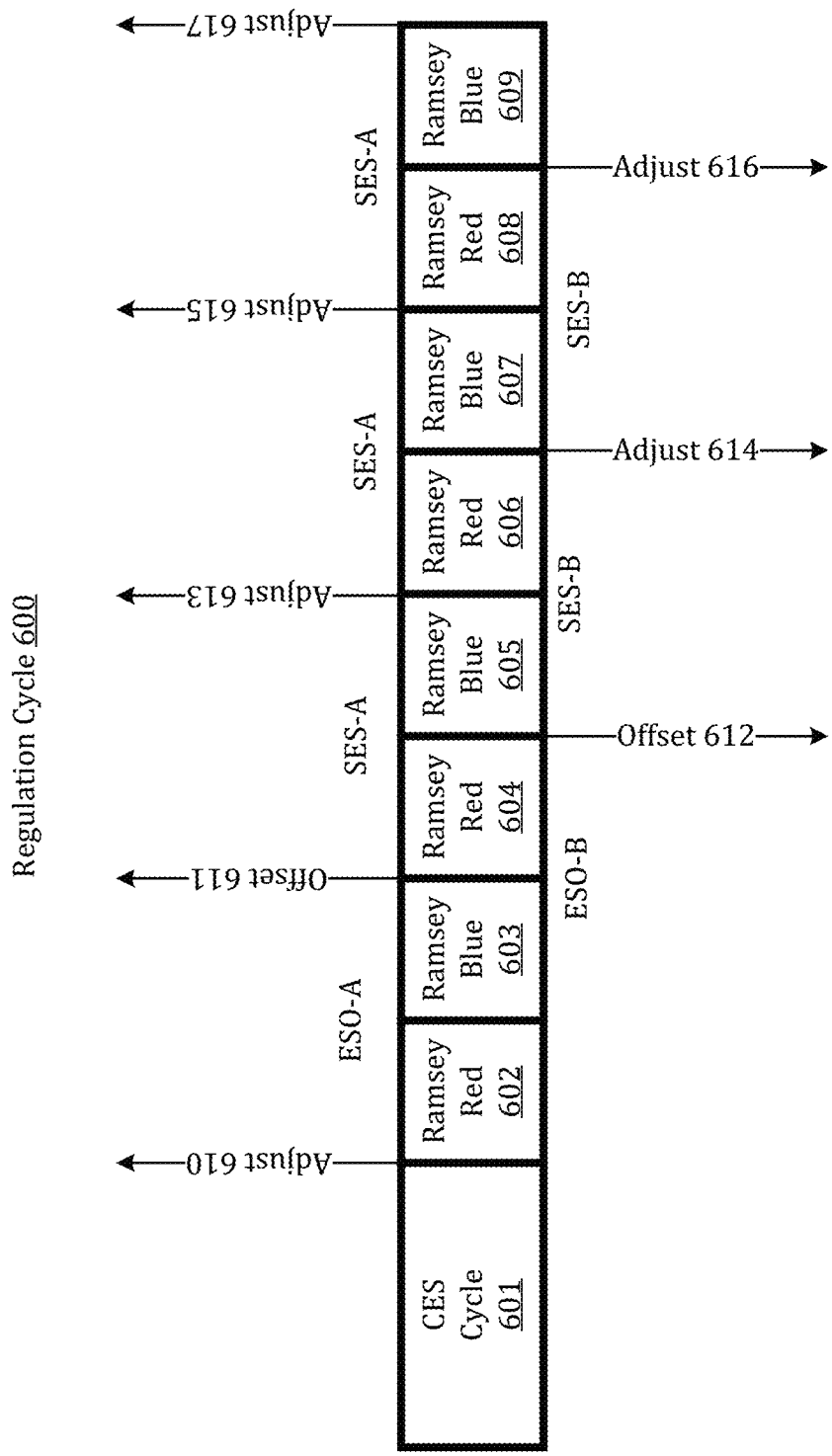
FIG. 6 is a diagram of a regulation protocol that adjusts clock frequency every Ramsey cycle of a series of SES cycles.

In the illustrated embodiment, CES cycles require four Ramsey cycles each, while SES cycles require two Ramsey cycles each. Feedback is received at best every other Ramsey cycle. In an alternative embodiment, feedback can be received after every Ramsey cycle during portions of a regulation cycle. For example, a regulation cycle 600, FIG. 6, begins with a CES cycle 601, resulting in a clock-frequency adjustment at 610. Next, red and blue Ramsey cycles 602-609 are performed. Red detuned Ramsey cycle 602 and blue-detuned Ramsey cycle 603 provide a first error signal offset value 611. The next red-detuned Ramsey cycle 604 can be combined with blue-detuned Ramsey cycle 603 to yield a second error signal offset 612.

Blue-detuned Ramsey cycle 605 can be combined with red-detuned Ramsey cycle 604 to form a first SES cycle, resulting in an adjustment 613 which uses offset 611. Red detuned Ramsey cycle 606 can be combined with blue-detuned Ramsey cycle 605 to yield an adjustment 614 that uses offset 612. Blue-detuned Ramsey cycle 607 can be combined with red-detuned Ramsey cycle 606 yielding an adjustment 615 which uses offset 611. Red detuned Ramsey cycle 608 can be combined with blue-detuned Ramsey cycle 607 to yield an adjustment 616 that uses offset 612. Blue-detuned Ramsey cycle 609 can be combined with red-detuned Ramsey cycle 608 yielding an adjustment 617 which uses offset 611. Thus, beginning with blue-detuned Ramsey cycle 605, regulation cycle 600 provides an adjustment every Ramsey cycle (until the current regulation cycle completes and the next one begins at 601).

Other embodiments use different transitions in $^{87}$Rb; other isotopes of rubidium can be used as can other alkali metals and/or alkaline earth metal atoms as the quantum state carriers. The resonant frequency for the transition in the illustrated embodiment is 6.835 GHz, which is in the microwave range; the different transitions used in other embodiments have different resonant frequencies. Greater precision can be achieved with higher clock frequencies, with the most precise embodiments operating at optical frequencies. While the illustrated embodiment is an "atomic" clock and, accordingly, uses atoms as quantum-state carriers, the invention provides for alternative quantum state carriers, including polyatomic molecules, impurities in solid state crystals, quantum dots, optical micro-resonators, and other photonic structures. Other embodiments include optical clocks based on the probing of ultra-narrow quadrupole, octupole, and two-photon transitions or direct frequency-comb spectroscopy.

Herein, a "quantum clock" is any time keeping device that relies on quantum phenomena to regulate a clock frequency. Quantum phenomena include discrete quantum states, superposition, entanglement, Rydberg blockades, and electromagnetically induced transparency (which, in turn, gives rise to dark states). Quantum clocks can use a variety of quantum state carriers (QSCs), e.g., atoms, polyatomic molecules, impurities in crystals, quantum dots, etc. Herein, "electromagnetic radiation" includes visible light, infra-red light, ultra-violet light, x-rays, microwave radiation, and longer radio frequency radiation.

Herein, "regulation cycle" encompasses any cycle used to regulate a target parameter, which, in the present context, is clock frequency. As the term is used herein, a regulation cycle can include error-signal cycles, in this case, long, e.g., CES cycles, ESO cycles, and short, e.g., SES cycles. CES and SES cycles qualify as "adjustment cycles" as they result in adjustments, while an ESO cycles qualify as error-signal cycles but not as adjustment cycles as they do not directly result in adjustments. "Measurement cycles", as used herein, refers to cycles that result in measurement signals, e.g., fluorescence or absorption signals. A "Ramsey cycle" is a measurement cycle that uses Ramsey spectroscopy.

Herein, all art labeled "prior art", if any, is admitted prior art; art not labeled "prior art" is not admitted prior art. The foregoing embodiments, as well as variations thereupon and modifications thereto are provided for by the present invention, the scope of which is defined by the following claims.

What is claimed is:

1. A quantum clock system comprising:
   a electromagnetic radiation (EMR) source;
   a clock frequency generator coupled to the EMR source so as to cause the EMR source to modulate EMR emitted by the EMR source;
   quantum-state carriers (QSCs) defining a set of one or more resonant frequencies, the QSCs being optically coupled to the EMR source for being illuminated by modulated EMR therefrom;
   a photodetector for measuring an optical characteristic of the QSCs after being illuminated by the EMR; and
   a controller that implements a series of clock-frequency regulation cycles, each regulation cycle including at least one long adjustment cycle and plural short adjustment cycles, the controller being coupled to the clock frequency generator for adjusting a clock frequency output thereof in response to each long cycle and in response to each short cycle, each long cycle containing at least three measurement cycles, each short cycle including at most two measurement cycles, each measurement cycle involving a measurement by the photodetector.

2. The quantum clock system of claim 1 wherein a ratio of a number of short cycles to a number of long cycles is at least 3:1.

3. The quantum clock system of claim 1 wherein each regulation cycle includes exactly one long cycle, the long cycle being a combination error signal (CES) cycle and the short cycles being single error signal (SES) cycles.

4. The quantum clock system of claim 3 wherein a ratio of a number of SES cycles to a number of CES cycles is at least 3:1.

5. The quantum clock system of claim 3 wherein each CES cycle includes four measurement cycles, and each SES includes two measurement cycles, all measurement cycles being Ramsey cycles.

6. The quantum clock system of claim 5 wherein each Ramsey cycle is characterized by a detuning relative to a dark combination of resonant frequencies and an evolve time for the QSCs, each evolve time extending between an illumination of the QSCs and a fluorescence measurement of the QSCs, the Ramsey cycles for the CES cycle including:
   a first red detuned illumination followed by a first relatively short evolve duration;
   a blue-detuned illumination followed by a second relatively short evolve duration;
   a second red detuned illumination followed by a first relatively long evolve duration; and
   a blue detuned illumination followed by a second relatively long evolve duration.

7. The quantum clock system of claim 1 wherein the EMR source includes a laser for outputting a single-mode EMR and an electro-optical modulator (EOM) for converting the single-mode EMR to multi-mode EMR.

8. The quantum clock system of claim 1 wherein a clock frequency is in a microwave range.

9. A quantum clock frequency adjustment process comprising a series of regulation cycles, each of the regulation cycles including:
   adjusting a quantum clock frequency of a quantum clock based on a long error-signal cycle, the long error-signal cycle including at least three measurement cycles; and
   making plural quantum clock frequency adjustments of the quantum clock based on respective ones of consecutive short error signal cycles, each short signal error cycle including at most two measurement cycles.

10. The quantum clock frequency adjustment process of claim 9 wherein each regulation cycle includes exactly one long cycle.

11. The quantum clock frequency adjustment process of claim 10 where each regulation cycle includes at least three short cycles.

12. The quantum clock frequency adjustment process of claim 11 wherein each long cycle is a combination error signal (CES) cycle, each short cycle is a single-error signal (SES) cycle, and each of the measurement cycles is a Ramsey cycle.

* * * * *